United States Patent [19]
Torigoe et al.

[11] Patent Number: 5,114,223
[45] Date of Patent: May 19, 1992

[54] EXPOSURE METHOD AND APPARATUS

[75] Inventors: Makoto Torigoe, Kawasaki; Hiroshi Sato, Tokyo, both of Japan

[73] Assignee: Canon Kabushiki Kaisha, Tokyo, Japan

[21] Appl. No.: 724,451

[22] Filed: Jul. 3, 1991

Related U.S. Application Data

[63] Continuation of Ser. No. 512,601, Apr. 23, 1990, abandoned, which is a continuation of Ser. No. 186,737, Apr. 22, 1988, abandoned, which is a continuation of Ser. No. 883,753, Jul. 9, 1986, abandoned.

[30] Foreign Application Priority Data

Jul. 15, 1985 [JP] Japan ............................. 60-155349
May 19, 1986 [JP] Japan ............................. 61-114194

[51] Int. Cl.⁵ ............................................. G03B 27/42
[52] U.S. Cl. ..................................... 353/101; 355/53; 353/122
[58] Field of Search .......................... 353/101, 85, 87; 355/55, 56, 57, 60, 62, 63, 40, 44, 69; 354/400, 402

[56] References Cited

U.S. PATENT DOCUMENTS

| | | | |
|---|---|---|---|
| Re. 31,219 | 4/1983 | Shenk | 354/400 |
| 3,794,421 | 2/1974 | Kano et al. | |
| 4,153,371 | 5/1979 | Koizumi | 356/400 |
| 4,269,505 | 5/1981 | Mayer | 355/62 |
| 4,284,336 | 8/1981 | Iwata | 354/266 X |
| 4,395,117 | 7/1983 | Suzuki | |
| 4,420,233 | 12/1983 | Nomoto | 353/99 X |
| 4,506,977 | 3/1985 | Sato et al. | 355/56 X |
| 4,600,282 | 7/1986 | Yamamura | 353/55 X |
| 4,615,614 | 10/1986 | Sugiyama | 355/55 X |
| 4,648,708 | 3/1987 | Kosugi | |

Primary Examiner—Harry N. Haroian
Attorney, Agent, or Firm—Fitzpatrick, Cella, Harper & Scinto

[57] ABSTRACT

An exposure method and apparatus in which a first member such as a reticle is illuminated with a light from a light source such as an excimer laser so that the image of a pattern carried by the first member is projected through a projecting optical system onto a second member such as a semiconductor wafer, thereby exposing the second member to the pattern. At least one of the first and the second members and the projecting optical system is adjusted along the optical axis of the projecting optical system and the focus condition of the pattern image on the second member is detected by a focus detecting device during the movement of the member. The exposure is effected in accordance with the output signal from the focus detecting device without requiring the movement of the member to be stopped.

29 Claims, 1 Drawing Sheet

EXPOSURE METHOD AND APPARATUS

This application is a continuation of prior application Ser. No. 07/512,601 filed Apr. 22, 1988, which application was a continuation of prior application, Ser. No. 07/186,737 filed Apr. 22, 1988, which application was a continuation of prior application, Ser. No. 06/883,753 filed Jul. 9, 1986, all now abandoned.

BACKGROUND OF THE INVENTION

1. Field of the Invention

The present invention relates to an exposure method and an exposure apparatus which are suitable for use in the production of semiconductor devices. More particularly, the present invention is concerned with an exposure method and an exposure apparatus which enable precise and rapid projection of delicate circuit patterns for, for example, an integrated circuit (IC) or a large-scale integrated circuit (LSI) carried by a reticle onto a semiconductor wafer through a projecting optical system, thereby exposing the wafer to the image of the circuit pattern.

2. Description of the Prior Art

The current semiconductor production technology is experiencing a trend toward a higher degree of integration and fineness of the circuit pattern. Optical exposure techniques for achieving such a high degree of integration and fineness of the circuit pattern have made remarkable progress by virtue of, for example, development of projecting optical systems having high resolution.

Production of semiconductor devices through optical exposure requires that a circuit pattern on the surface of a reticle be transferred to and printed on the surface of a wafer, which essentially requires projection of the circuit pattern image on the wafer surface with high precision, i.e., by focusing the image on the wafer with high precision.

However, in the conventional exposure method, one of a reticle and a wafer is moved relatively to the other while the condition of focus of the circuit pattern image on the wafer is observed through an observation system. The movement is stopped when the circuit pattern image is focused. After that, the wafer surface is exposed to print the circuit pattern thereon. This conventional method, therefore, suffers from an impractically low throughput.

In addition, printing of a multiplicity of circuit patterns on a wafer requires repetition of the precise focusing operation several times, and thereby requires much labor and time.

SUMMARY OF THE INVENTION

Accordingly, it is an object of the present invention to provide an exposure method and apparatus which enable highly precise and rapid projection of the circuit pattern image on the wafer and, hence, highly precise and rapid exposure of the wafer to the circuit pattern image.

Another object of the present invention is to provide an exposure method and apparatus in which the exposure is conducted without requiring stopping of the movement of a reticle or a wafer when the image of the circuit pattern carried by the reticle is focused on the wafer, thereby attaining a high throughput.

According to one aspect of the present invention, there is provided an exposure method in which a first member is illuminated with light from a light source so that the image of a pattern carried by the first member is projected through a projecting optical system onto a second member, thereby exposing the second member to the pattern. The method comprises the steps of adjusting or moving at least one of the first and second members and the projecting optical system along the optical axis of the projecting optical system; detecting, by a focus detecting means, the condition of focus of the image of the pattern on the second member during the adjustment of at least one of the first and second members and the projecting optical system; and effecting exposure of the second member in response to an output signal from the focus detecting means during adjustment of at least one of the first and second members and the projecting optical system along the optical axis of the projecting optical system.

According to another aspect of the present invention, there is provided an exposure apparatus in which a first member is illuminated with light from a light source so that the image of a pattern carried by the first member is projected through a projecting optical system onto a second member, thereby exposing the second member to the pattern. The apparatus comprises means for adjusting at least one of the first and second members and the projecting optical system along the optical axis of the projecting optical system; focus detecting means for monitoring the focus condition of the image on the second member during the adjustment of at least one of the first and second members and the projecting optical system; and exposure means for effecting exposure of the second member in response to an output signal from the focus detecting means during adjustment of at least one of the first and second members and the projecting optical system.

The above and other aspects, features and advantages of the present invention will become clear from the following description of the preferred embodiment taken in conjunction with the accompanying drawing.

DESCRIPTION OF THE PREFERRED EMBODIMENT

Figure 1:
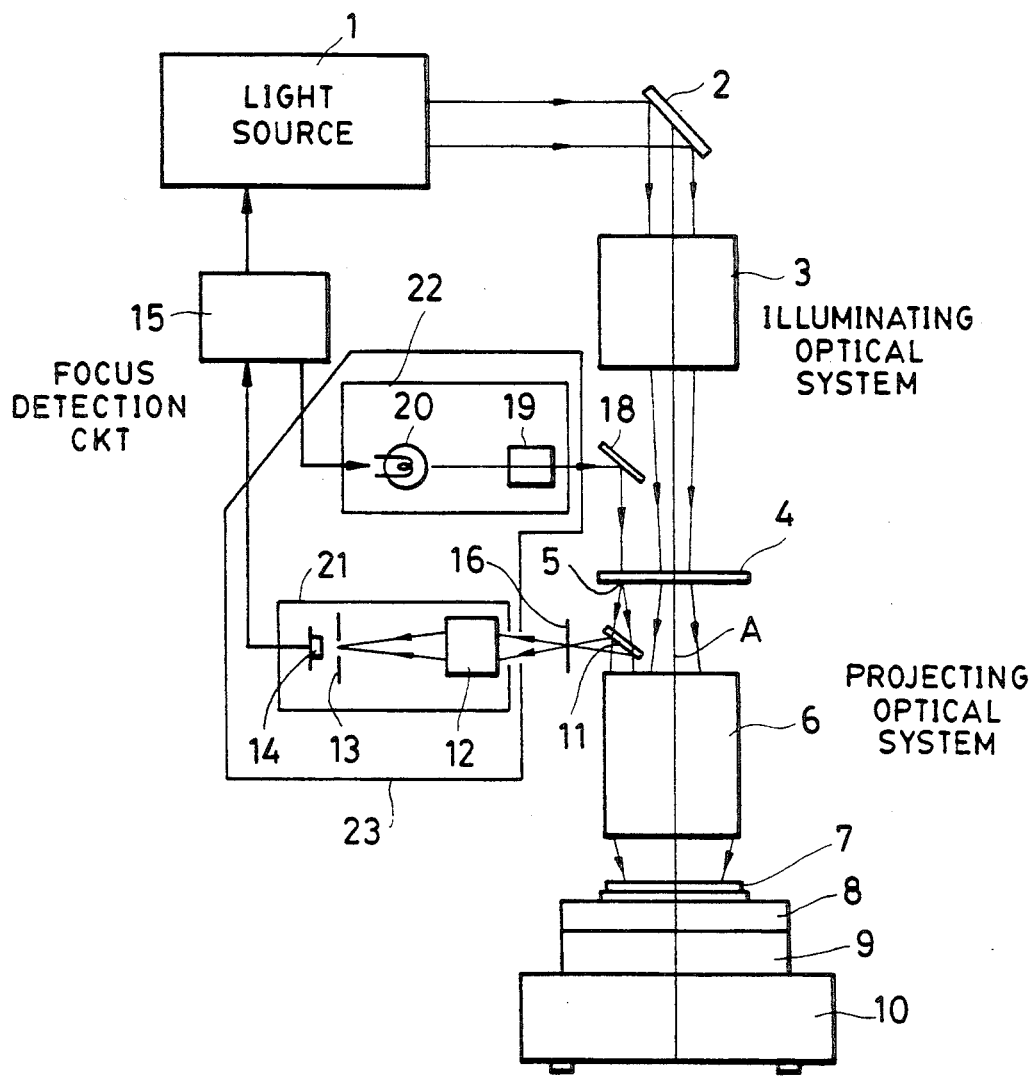
FIG. 1 is a schematic illustration of an embodiment of an exposure apparatus in accordance with the present invention.

Referring first to FIG. 1, an exposure apparatus embodying the present invention includes an exposure light source 1 of the pulse-oscillating type, such as an excimer laser, for producing, for example, a laser beam. An inclined mirror 2 is arranged to reflect the laser beam from the source 1. An illuminating optical system 3 is designed for converting the reflected light beam into a beam of a predetermined number of apertures (NA) so as to uniformly illuminate a surface of a reticle 4 which constitutes a first member in accordahce with the present invention. The reticle 4 has a delicate and minute circuit pattern formed thereon. The reticle 4 also has a focus mark 5 (referred to as an "AF mark" hereinafter) for automatic detection of the focal point. The AF mark 5 is constituted by a delicate and minute blank pattern. A projecting optical system 6 is arranged to project the image of the circuit pattern on the reticle 4 onto a wafer 7 which constitutes a second member in accordance with the present invention. Usually, the circuit pattern is projected onto the wafer at a reduced scale, e.g., 1/5 or 1/10 of the size of the original circuit pattern. The wafer 7 is carried by a Z stage 8 which is adapted to move the wafer 7 in the direction of the optical axis A of the projecting optical system 6. The Z stage 8 is carried by an XY stage 9 which is adapted to effect alignment of the wafer 7 with the reticle 4 in X and Y directions which are mutually perpendicular to the optical axis A of the projecting optical system 6.

The output side of the projecting optical system 6 constitutes a so-called telecentric optical system so that the magnification of projection is not changed by a slight movement of the wafer 7 in the direction of the optical axis. The XY stage 9 carrying the Z stage 8 and hence the wafer 7 is situated on a stool 10 which is constructed to avoid any vibration. A half mirror 11 is disposed between the AF mark 5 and a part of the projecting optical system 6. A focus detecting optical system 12 is disposed to receive light from the mirror 11 and is constituted by, for example, a microscope. A slit 13 and a photodetector 14 are disposed to receive light from the focus detecting optical system 12. The optical system 12, slit 13 and the photodetector 14 constitute a part of a light-receiving means 21 in accordance with the invention.

A mirror 18, an illuminating optical system 19 and a continuously-oscillating type light source 20 such as a mercury lamp, are arranged to illuminate the AF mark 5. The illuminating light source 20 and the illuminating optical system 19 constitute a part of illuminating means 22 in accordance with the invention. The light-receiving means 21 and the illuminating means 22 in combination constitute a part of detecting means 23.

A focus detection circuit 15 has a trigger pulse generating circuit which operates in response to a signal from the photodetector 14 so as to produce a trigger pulse for driving the exposure light source 1 in a pulsating manner. The illustrated embodiment further has an alignment optical system for use in attaining alignment between the reticle 4 and the wafer 7. This alignment optical system, which is well known by those skilled in the art, however, is omitted from the drawing for the purpose of simplification of illustration.

In this embodiment, the illuminating light source 20 is driven in accordance with an instruction given by the focus detection circuit 15. The beam of continuously oscillated light from the illuminating light source 20 is converged by the illuminating optical system 19 and, after being reflected by the mirror 18, illuminates the AF mark 5 provided on a portion of the surface of the reticle 4, whereby the image of the AF mark 5 is projected on the surface of the wafer 7 through the projecting optical system 6.

The image of the AF mark 5 on the surface of the wafer 7 is then formed on an image forming plane 16 by the projecting optical system 6 and the half mirror 11 and again in the vicinity of the slit 13 by the focus detecting optical system 12. The slit 13 and the reticle 4 are disposed at optically conjugate positions. Therefore, when the image of the AF mark 5 is focused on the surface of the wafer 7, the image of the AF mark 5 on the slit 13 is sharply focused.

In the illustrated embodiment, the size of the aperture of the slit 13 is selected to be substantially equal to that of the AF mark 5, so that the quantity of light passing through the slit 13 is maximized when the image of the AF mark 5 is properly focused on the wafer surface 7.

Figure 2:
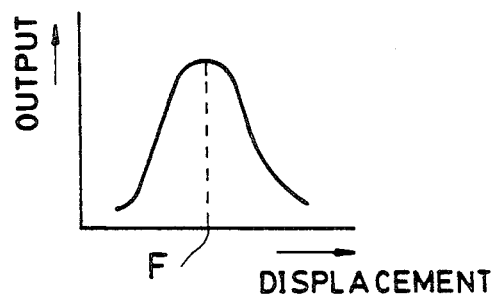
FIG. 2 is an illustration of an output signal, corresponding to the focus condition of the circuit pattern image on a wafer derived from a photo detector.

In the out-of-focus condition, however, the quantity of light passing through the slit 13 is reduced. The quantity of light passing through the slit 13 is detected and converted into an electric signal by the photodetector 14. The electric signal is input to the detection circuit 15. In the illustrated embodiment, the Z stage 8 carrying the wafer 7 is adapted to be moved in opposite directions along the optical axis of the projecting optical system 6. The focus condition of the image of the AF mark 5 on the wafer 7 is progressively changed as a result of continuous movement of the Z stage 8 in one direction. In consequence, the output signal from the photodetector 14 is changed in relation to the displacement of the Z stage 8 in a manner shown in FIG. 2 in which the abscissa represents the displacement. It will be seen that the position F of the Z stage 8 where the level of the output signal from the photodetector 14 is maximized corresponds to the in-focus position, i.e., the position where the image of the circuit pattern carried by the reticle 4 is formed on the wafer 7 in the optimum condition. It is thus possible to focus the image of the circuit pattern through detection of the position F where the level of the output signal from the photodetector 4 is maximized. The detection circuit 15 includes means for storing information concerning the position F or the level of the output signal from the photodetector 14. When the position F is reached during backward movement of the Z stage 8 or, alternatively, during the forward movement of the same after backward movement of the same, the trigger pulse generating circuit in the detection circuit 15 is activated to produce a trigger pulse, thereby driving the exposure light source 1, without requiring the movement of the wafer 7 to be stopped, whereby the wafer 7 is exposed to the circuit pattern on the reticle 4.

In the illustrated embodiment, the depth of focus of the projecting optical system and the fluctuation of the focal point of the same are on the order of several micron meters, so that the driving stroke of the Z stage 8 may be as small as 20 micron meters or so. The focusing operation, therefore, can be accomplished in a very short time, even though the Z stage 8 is repeatedly moved back and forth in order to attain a higher precision of the focus detection. It is thus possible to complete the focusing operation quickly and with high precision. The Z stage 8 may be moved either in a stepped manner or linearly by a step motor or a continuous motor, respectively (not shown). When an excimer laser is used as the exposure light source 1, since the pulse width of the excimer laser pulse is as short as 10 to 20 nsec, the travel of the Z stage 8 during the exposure is so small that the amount of any out-of-focus state at exposure is negligibly small. This means that the throughput is remarkably improved by the use of the excimer laser.

More specifically, in the illustrated embodiment, the elements are arranged so as to meet the following condition:

$$V \cdot S << \delta$$

where, V represents the velocity of movement of the Z stage 8 (mm/sec), S represents the exposure time of the wafer 7 (sec) and $\delta$ represents the depth of focus of the projecting optical system 6 for obtaining the desired resolution.

With this arrangement, the wafer 7 can be exposed to the circuit pattern without requiring the Z stage 8 to be stopped. in contrast to the conventional method in which the Z stage 8 has to be stopped for each exposure. Thus a high throughput is attained by the present invention.

According to the present invention, it is possible to use, in place of the pulsating light source 1 such as the excimer laser used in the illustrated embodiment, a combination of a continuously oscillating light source such as a mercury lamp and a shutter which is operatively connected to the detection circuit 15. In such a case, the shutter may be disposed at any suitable position in the path of the exposure light beam.

It is also possible to omit the optical system 12, i.e., to dispose the slit 13 directly at the position of the image-forming plane 16.

It is even possible to focus the image of the circuit pattern by moving the projecting optical system 6 while maintaining the first and the second members, i.e., the reticle 4 and the wafer 7 stationary, although in the described embodiment the in-focus condition is attained by moving either one of the first and the second members along the optical axis of the projecting optical system 6.

In the described embodiment of the present invention, the operation for emitting the exposure light pulse from the exposure light source 1 in response to the in-focus signal from the detection circuit 15 may involve a certain time lag due to a reason peculiar to the circuit construction. In such a case, it is advisable to incorporate a compensation circuit which advances the timing of the exposure light pulse so as to compensate for such a time lag. The detection of the in-focus condition can be modified in various manners. For instance, the in-focus condition can be detected through detection of the barycentre of the light quantity distribution or through detection of a point where the differentiated value of the change in the light quantity becomes zero. The use of the differentiated value is advantageous in that it enables a higher speed of detection of the in-focus condition because the detection can be accomplished by one-way stroking of the Z stage 8 from a reference position to the position F where the image of the circuit pattern is focused on the wafer.

It is to be understood also that, although the descibed embodiment employs only one focus detecting means having the AF mark 5, the apparatus of the present invention can employ a plurality of such focus detecting means. With such an arrangement, it is possible to detect the in-focus condition with high precision, taking into account also any curvature or inclination of the wafer 7.

The part of the light-receiving means 21, which in the described embodiment is disposed between the reticle 4 and the projecting optical system 6, may be provided between the projecting optical system 6 and the wafer 7.

The focusing of the image of the circuit pattern may be conducted by moving the reticle 4 up and down while the wafer 7 is maintained stationary, provided that the incident side of the projecting optical system 6 is constituted by a so-called telecentric optical system. In this case, the depth of focus is increased in the region near the reticle 4 in inverse proportion to the square of the magnification of the projecting optical system 6 as compared with the region near the wafer 7. That is, the depth of focus is 25 times as large as that in the region near the wafer 7, provided that the magnification is 1/5.

With this arrangement, therefore, the precision of the focusing operation is further increased.

In the described embodiment, the light from the illuminating light source 20 and the light from the exposure light source 1 may have different wavelengths. In such a case, it is necessary to correct color aberration on the projecting optical system 6 in accordance with respective wavelengths or, alternatively, to provide a compensating optical system in the path of the light beam from the AF mark 5.

In the described embodiment, the image of the AF mark 5 provided on the reticle 4 is projected onto the surface of the wafer 7 through the projecting optical system 6. This technique, however, is not exclusive and the detection of the focus condition may be conducted by directly projecting the image of the AF mark 5 without using the projecting optical system and then detecting the focus condition of the image of the AF mark 5 on the wafer. Another known focus detection means such as the image sharpness detection type, image correlation type, etc. (especially well known in the field of automatic focusing cameras) can be used and the in-focus signal from such means may be used to drive the light source 1.

Other changes and modifications are possible without departing from the scope of the invention which is limited solely by the appended claims.

What is claimed is:

1. An exposure method in which a first member is illuminated with light from a light source so that the image of a pattern carried by said first member is projected through a projecting optical system onto a second member, thereby exposing said second member to said pattern, said method comprising the steps of:

continuously moving said second member along the optical axis of said projecting optical system so that the state of formation of an image, carried on said first member, on said second member by said projecting optical system changes from one out-of-focus condition to another out-of-focus condition with an in-focus condition therebetween, the projecting optical system being telecentric at an output side thereof;

detecting, by a focus detection means, the focus condition of said image of said pattern on said second member during the continuous movement of said second member and producing an output signal representing the focus condition; and effecting exposure of said second member in response to the output signal from said focus detecting means during the continuous movement of said second member along said optical axis of said projecting optical system without requiring that said movement be stopped in order to achieve said exposure.

2. An exposure method according to claim 1, wherein said light source is a pulsed light source which emits a light in the form of light pulses, and the exposure of said second member is effected by said light in the form of light pulses.

3. An exposure apparatus in which a first member is illuminated with light from a light source so that the image of a pattern carried by said first member is projected through a projecting optical system onto a second member, thereby exposing said second member to said pattern, said apparatus comprising:

means for continuously moving said second member along the optical axis of said projecting optical system so that the state of formation of an image, carried on said first member, on said second member by said projecting optical system is changed from one out-of-focus condition to another out-of-focus condition with an in-focus condition therebetween;

focus detecting means for monitoring the focus condition of said image on said second member during the continuous movement of said second member and for producing an output signal representing the focus condition; and means for effecting exposure of said second member in response to the output signal from said focus detecting means during the continuous movement of said second member without requiring that the movement be stopped in order to achieve the exposure;

wherein said projecting optical system is telecentric at an output side thereof.

4. An exposure apparatus according to claim 3, wherein said light source is a pulsed a light source which emits a light in the form of light pulses, and the exposure of said second member is effected by said light in the form of light pulses.

5. An apparatus for recording an optical pattern carried on a first member onto a photosensitive surface on a second member, comprising:

illumination means for illuminating and selectively exposing the optical pattern;

projection means for projecting an image of the optical pattern on the first member, illuminated by said illumination means, onto the photosensitive surface on the second member, said projection means being telecentric at an output side thereof;

changing means for changing the state of image formation for continuously changing the state of formation of the image on the first member on the photosensitive surface on the second member by said projecting optical system from one out-of-focus condition to another out-of-focus condition with an in-focus condition therebetween by moving said second member; and focus detecting means for detecting the focus condition of the projected image of the optical pattern on the photosensitive surface during the continuous change of the state of image formation by said changing means, said detecting means including trigger means for triggering said illumination means when a substantially in-focus condition is detected by said detecting means between the image and the surface to expose the surface to the pattern, without requiring that the change of the state of image formation by said changing means be stopped in order to achieve the exposure.

6. An apparatus according to claim 5, wherein said projecting optical system has an optical axis; and wherein said focus adjusting means is arranged to move the photosensitive surface along the optical axis of said projecting optical system for adjusting the focus of the image on the surface.

7. An apparatus according to claim 5, wherein said illumination means includes a pulsed light source which is arranged to generate pulsed light.

8. An apparatus for transferring a pattern carried on a first object onto a second object, said apparatus comprising:

light source means for generating a pulsed light beam for illuminating said pattern carried on said first object;

a projecting optical system for projecting said pattern illuminated by said light source means onto said second object, said pattern being transferred onto said second object by means of projection by said projecting optical system said projecting optical system being telecentric at an output side thereof;

means for continuously moving said second object along the optical axis of said projecting optical system said continuously moving means reciprocating said second object in such a manner that the state of formation of said image, carried on said first member, onto said second member by said projecting optical system, is repeatedly changed from one out-of-focus condition to another out-of-focus condition with an in-focus condition therebetween;

means for detecting the state of formation of said image of said pattern on said second object and for detecting the in-focus condition when said second object is moved in one direction by said moving means; and means for controlling said light source means to cause said light source means to generate said pulsed light beam on the basis of the result of said detection while said second object is moving in the opposite direction to said one direction, the generation of said beam being effected without requiring that said movement be stopped at the in-focus condition.

9. An apparatus for transferring a pattern carried on a first object onto a sensitive member carrie don a second object, said apparatus comprising:

illuminations means for illuminating the pattern carried on the first object;

a focusing optical system for focusing the pattern, carried on the first object and illuminated by light from said illumination means, on the sensitive member carried on the second object, said focusing optical system transferring the pattern onto the sensitive member by focusing means and said focusing optical system being telecentric at an output side thereof;

moving means for continuously moving the second object along an optical axis of said focusing optical system, said moving means moving the second object such that the second object traverses an in-focus position of the pattern focused by said focusing optical system;

focus detecting means for detecting a positional relationship between the in-focus position of the pattern and a position of the sensitive member; and control means for controlling said illumination means based on a detection result of said focus detecting means so that said illumination means begins illumination during the movement of the second object, without requiring that the movement be stopped.

10. An apparatus according to claim 9, wherein said control means controls said illumination means so that said illumination means begins illumination when the sensitive member is moved to the in-focus position.

11. An apparatus for transferring a pattern carried on a first object onto a sensitive member carried on a second object, said apparatus comprising:

illumination means for illuminating the pattern carried on the first object, said illumination means comprising a pulsed laser light source and effecting illumination by a pulsed laser light from said pulsed laser light source;

a focusing optical system for focusing the pattern, carried on the first object and illuminated by the pulsed laser light from said illumination means, onto the sensitive member carried on the second object, said focusing optical system being telecentric at an output side thereof;

moving means for continuously moving the second object along an optical axis of said focusing optical system, said moving means moving the second object such that the second object traverses an in-focus position of the pattern focused by said focusing optical system;

focus detecting means for detecting a positional relationship between the in-focus position of the pattern and a position of the sensitive member; and control means for controlling said pulsed laser light source based on a detection result of said focus detecting means so that said pulsed laser light source generates the pulsed laser light during the movement of the second object, without requiring that the movement be stopped.

12. An apparatus according to claim 11, wherein said control means controls said pulsed laser light source so that said light source generates the pulsed laser light when the sensitive member is moved to the in-focus position.

13. A process for manufacturing semiconductor devices in which an image is focused on a wafer at a focal plane of an optical system, said process comprising the steps of:

moving the wafer along the optical axis of the optical system so that the wafer approaches the focal plane of the optical system; and exposing the wafer to the image through the optical system when the wafer is substantially positioned at the focal plane, without stopping movement of the wafer along the optical axis, wherein the optical system is telecentric on its light emitting side.

14. A process according to claim 13, further comprising projecting an image of a mark on the wafer through the optical system, and determining whether the image of the mark is substantially focused on the wafer at the focal plane based on contrast of the image of the mark.

15. A process according to claim 14, wherein the mark is formed on a mask.

16. A process according to claim 13, wherein said exposing step comprises the steps of directing the laser beam through a circuit pattern to the optical system, and projecting the image of the circuit pattern on the wafer with the optical system.

17. A process according to claim 16, wherein the laser beam comprises a pulse laser beam.

18. A projection exposure apparatus comprising:

projecting means for projecting an image of a circuit pattern of an original through a projecting optical system on an image plane of said optical system, wherein said projecting optical system is arranged so that the image plane side is telecentric;

carrying means for carrying a wafer and for moving the wafer in a direction of an optical axis of said projecting optical system so that a surface of the wafer approaches a focal plane of said projecting optical system;

detecting means for detecting a substantial correspondence of the surface of the wafer and the image plane of said projecting optical system and for producing a detection output; and control means for projecting an image on the wafer with said projecting means according to the detection output produced by said detecting means, without stopping movement of the wafer in the direction of the optical axis.

19. An apparatus according to claim 18, wherein said projecting means comprises a pulse laser for emitting light pulses, and means for illuminating the circuit pattern with light pulses from said laser.

20. An apparatus according to claim 18, wherein said detecting means comprises means for performing the detection without using said projecting optical system.

21. An apparatus according to claim 18, wherein said detecting means comprises means for performing the detection of using said projecting optical system.

22. An apparatus according to claim 21, wherein said detecting means comprises:

means for illuminating a mark formed on the original, applying light from the mark to the wafer through said projecting optical system and reflecting the light on the wafer;

a member provided with a predetermined aperture which receives the mark image formed by the light reflected on the wafer through said projecting optical system; and a detector for detecting the light reflected on the wafer through the aperture of said member, wherein the aperture of said member is arranged so that a quantity of the light which is reflected on the wafer and enters said detector becomes maximum when the surface of the wafer and the image plane of said projecting optical system substantially correspond.

23. A projection exposure apparatus comprising:

projecting means for projecting an image of a circuit pattern of an original through a projecting optical system on an image plane of said optical system, wherein said projecting optical system is arranged so that the image plane side is telecentric;

carrying means for carrying a wafer and for moving the wafer in a direction of an optical axis of said projecting optical system so that a surface of the wafer approaches a focal plane of said projecting optical system;

detecting means for detecting a position of the surface of the wafer while the wafer is moving in the direction of the optical axis; and control means for projecting the image on the wafer with said projecting means, without stopping movement of the wafer in the direction of the optical axis, when said detecting means detects that the surface of the wafer has reached the focal plane.

24. An apparatus according to claim 23, wherein said projecting means comprises a pulse laser for emitting light pulses, and means for illuminating the circuit pattern with light pulses from said laser.

25. An apparatus according to claim 23, wherein said detecting means comprises means for performing the detection without using said projecting optical system.

26. An apparatus according to claim 23, wherein said detecting means comprises means for performing the detection by using said projecting optical system.

27. A projection exposure apparatus, wherein a surface of a wafer reaches an image plane while being moved along an optical axis of a projecting optical system so that the wafer surface corresponds to the image plane and an image of a circuit pattern is projected on the wafer through the projecting optical projection system, said apparatus comprising:

projecting means for projecting the image: without stopping movement of the wafer in the direction of the optical axis, when the wafer surface substantially corresponds to the image plane, wherein the optical projection system comprises a telecentric optical system.

28. A semiconductor manufacturing method comprising the steps of:

moving a wafer in a direction of an optical axis of a projecting optical system such that a surface of the wafer approaches an image plane of the projecting optical system and the wafer surface corresponds to a focal plane of the projecting optical system; and projecting a circuit pattern of the wafer through the projecting optical system, without stopping movement of the wafer in the direction of the optical axis, when the surface of the wafer substantially corresponds to image plane, wherein the projecting optical system is telecentric on an image plane side.

29. A method according to claim 28, wherein said projecting step comprises emitting laser pulses from an excimer laser.

* * * * *

UNITED STATES PATENT AND TRADEMARK OFFICE
CERTIFICATE OF CORRECTION

PATENT NO. : 5,114,223

DATED : May 19, 1992

INVENTOR(S) : Makoto Torigoe, et al.

It is certified that error appears in the above-identified patent and that said Letters Patent is hereby corrected as shown below:

COLUMN 1

Line 5, "Ser. No. 07/512,601 filed Apr. 22, 1988," should read --Ser. No. 07/512,601 filed Apr. 23, 1990,--.

COLUMN 2

Line 60, "accordahce" shoudl read --accordance--.

COLUMN 3

Line 67, "theslit 13" should read --the slit 13--.

COLUMN 7

Line 21, "a" (second occurrence) should be deleted.

COLUMN 8

Line 8, "system said" should read --system, said--;
Line 12, "system said" should read --system, said--;
Line 34, "carrie don" should read --carried on--; and
Line 36, "illuminations" should read --illumination--.

UNITED STATES PATENT AND TRADEMARK OFFICE
CERTIFICATE OF CORRECTION

PATENT NO. : 5,114,223
DATED : May 19, 1992
INVENTOR(S) : Makoto Torigoe, et al.

It is certified that error appears in the above-identified patent and that said Letters Patent is hereby corrected as shown below:

COLUMN 11

Line 4, "pro-" should be deleted;
Line 5, "jection" should be deleted; and
Line 15, "system such" should read --system, such--.

COLUMN 12

Line 5, "of" should read --on--; and
Line 9, "image plane," should read --the image plane,--.

Signed and Sealed this

Tenth Day of August, 1993

Attest:

MICHAEL K. KIRK

Attesting Officer    Acting Commissioner of Patents and Trademarks